(12) United States Patent
Lu et al.

(10) Patent No.: US 7,333,039 B2
(45) Date of Patent: Feb. 19, 2008

(54) DUAL MODE SAMPLE AND HOLD CIRCUIT AND CYCLIC PIPELINE ANALOG TO DIGITAL CONVERTER USING THE SAME

(75) Inventors: Wu-Hung Lu, Taipei (TW); Yi-Bin Hsieh, Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 11/537,678

(22) Filed: Oct. 2, 2006

(65) Prior Publication Data

US 2007/0090984 A1   Apr. 26, 2007

(30) Foreign Application Priority Data

Oct. 24, 2005   (TW) .............................. 94137162 A

(51) Int. Cl.
*H03M 1/00* (2006.01)

(52) U.S. Cl. ...................................... 341/122

(58) Field of Classification Search ......... 341/122–125
See application file for complete search history.

(56) References Cited

U.S. PATENT DOCUMENTS 5,111,195 A * 5/1992 Fukuoka et al. ............ 345/204

* cited by examiner

*Primary Examiner*—Brian Young
(74) *Attorney, Agent, or Firm*—Thomas, Kayden, Horstemeyer & Risley

(57) ABSTRACT

A cyclic pipeline analog to digital converter includes a dual mode sample and hold circuit, a multiplying digital to analog converter (MDAC), a sub-analog to digital converter (sub-ADC) and a decoder. The dual mode sample and hold circuit has a charge-redistribution mode and a flip-around mode. The dual mode sample and hold circuit receives first and second input voltages and first and second feedback voltages and generates a differential output signal pair. The MDAC receives the differential output signal pair and a digital multiplying word and generates the first and second feedback voltages. The sub-ADC receives the differential output signal pair and generates the digital multiplying word and a digital output word. The decoder converts the digital output word to a digital output corresponding to the first and second input voltages.

8 Claims, 5 Drawing Sheets

DUAL MODE SAMPLE AND HOLD CIRCUIT AND CYCLIC PIPELINE ANALOG TO DIGITAL CONVERTER USING THE SAME

BACKGROUND OF THE INVENTION

1. Field of the Invention

The invention relates to cyclic pipeline analog to digital conversion and, in particular, to cyclic pipeline analog to digital converters with dual mode sample and hold circuits.

2. Description of the Related Art

Cyclic pipeline analog to digital converters (ADC) are important in high speed circuit design. However, it is difficult to design a small-area, high-speed, and precise analog to digital circuit, especially considering inherent errors of capacitors and resistors generated during processing. Generally, tolerance of capacitance error is about 0.1%. As a result, precision of analog to digital converters is limited within 10 bits.

In typical circuit architecture, single end signals are often used because of smaller area and lower power consumption. Single end signals, however, are more easily disturbed by noise. Thus, if a circuit architecture is more sensitive to noise, differential signals are often used to reduce influence of common noise. In cyclic pipeline analog to digital converters, signal sources typically generate single end signals. Single end inputs are thus often used in analog to digital converter design and performance thereof is often influenced by nonlinear errors. If a differential input is adopted, a single end to differential end circuit needs to be added to a front stage circuit. Even if a single end to differential end circuit is added, optimum performance cannot be achieved.

In cyclic pipeline analog to digital converters, input signals are often sampled by a sample and hold circuit to precisely receive input signals. There are mainly two architectures: charge-redistribution and flip-around. Charge-redistribution cyclic pipeline ADCs often use single end signals and flip-around cyclic pipeline ADCs often use differential signals.

FIG. 1A is a circuit diagram of a sample and hold circuit in a charge-redistribution cyclic pipeline ADC. In such a sample and hold circuit, signals are stored in sampling capacitors Cs when a sampling signal $\Phi 1$ is high and a holding signal $\Phi 2$ is low. At the next time, the charge stored in the sampling capacitors Cs is transferred to a hold capacitor Cf when sampling signal $\Phi 1$ is low and holding signal $\Phi 2$ is high. FIG. 1B is a circuit diagram of a sample and hold circuit in a flip-around cyclic pipeline ADC. In such a sample and hold circuit, signals are stored in sampling capacitors Cs when sampling signal $\Phi 1$ is high and holding signal $\Phi 2$ is low. At the next time, input terminals of the sampling capacitors Cs are connected to output terminals the differential operational amplifier when sampling signal $\Phi 1$ is low and holding signal $\Phi 2$ is high.

In a charge-redistribution scheme, since charges are transferred from the sampling capacitors Cs to the hold capacitors Cf, variation in input common range has only little side effect. Thus, the charge-redistribution scheme is suitable for applications with single end signals. Moreover, the sampling capacitors and the holding capacitors need to be the same. There is, however, error of 0.1% (corresponding to accuracy of 10 bit) in capacitor matching in CMOS technology. When errors in each stage accumulate, differential nonlinearity (DNL) is significant, resulting in significant integral nonlinearity (INL). Thus, performance of the analog to digital converter is significantly degraded.

In a flip-around scheme, the same capacitor is used to accomplish sampling and holding. Not only half noise (kT/C) is cut off but also errors in capacitor matching are diminished. This scheme, however, is suitable for applications with differential signals. If an input signal is a single end signal, variation in input common range leads to errors in output common range, making single end signal not suitable for this scheme, especially in high speed circuits.

BRIEF SUMMARY OF THE INVENTION

An embodiment of a cyclic pipeline analog to digital converter includes a dual mode sample and hold circuit, a multiplying digital to analog converter (MDAC), a sub-analog to digital converter (sub-ADC) and a decoder. The dual mode sample and hold circuit has a charge-redistribution mode and a flip-around mode. The dual mode sample and hold circuit receives first and second input voltages and first and second feedback voltages and generates a differential output signal pair. The MDAC receives the differential output signal pair and a digital multiplying word and generates the first and second feedback voltages. The sub-ADC receives the differential output signal pair and generates the digital multiplying word and a digital output word. The decoder converts the digital output word to a digital output corresponding to the first and second input voltages. Wherein the dual mode sample and hold circuit is performed in the charge-redistribution mode, and then performed in the flip-around mode.

An embodiment of a method of dual mode sampling and hold includes transferring charge stored in a sampling capacitor pair to a holding capacitor pair in a charge-redistribution mode and providing an output signal corresponding to the charge stored in the holding capacitor pair to a differential output pair of a differential operational amplifier in a flip-around mode. More specifically, the charge-redistribution mode is followed by the flip-around mode.

The invention combines a charge-redistribution mode and a flip-around mode in a dual mode sample and hold circuit such that input signal is not limited to single end signal only or differential signal only. Charge-redistribution increases input common mode range and reduces impact caused by common mode errors. Flip-around reduces errors caused by noises on a circuit and capacitor matching. Combination of charge-redistribution and flip-around results in better performance. Such a circuit architecture not only reduces errors of differential nonlinearity (DNL) and integral nonlinearity (INL) of a digital to analog converter but also increases signal to noise distortion ratio (SNDR).

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
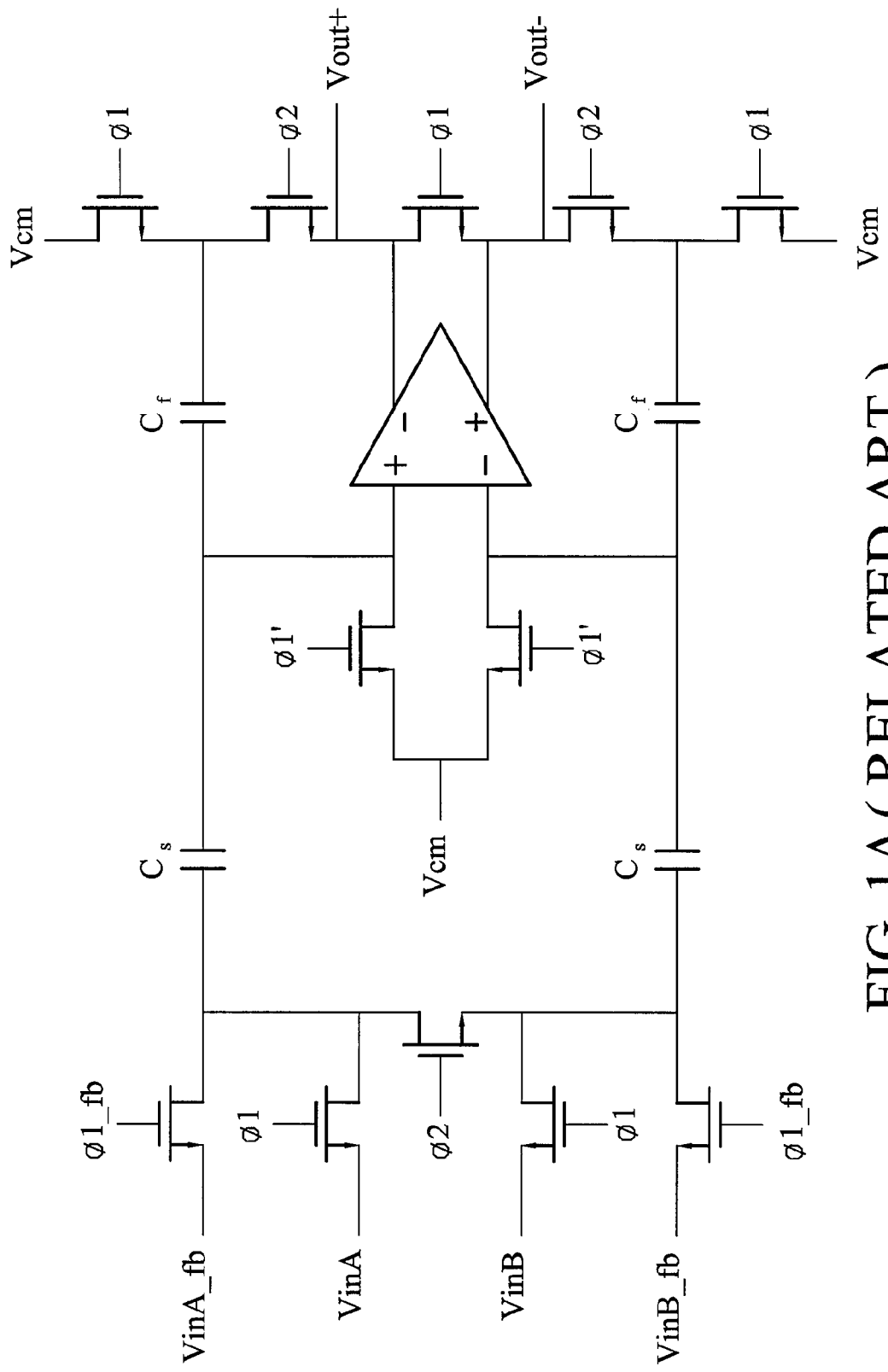
FIG. 1A is a circuit diagram of a sample and hold circuit in a charge-redistribution cyclic pipeline ADC.
Figure 1B:
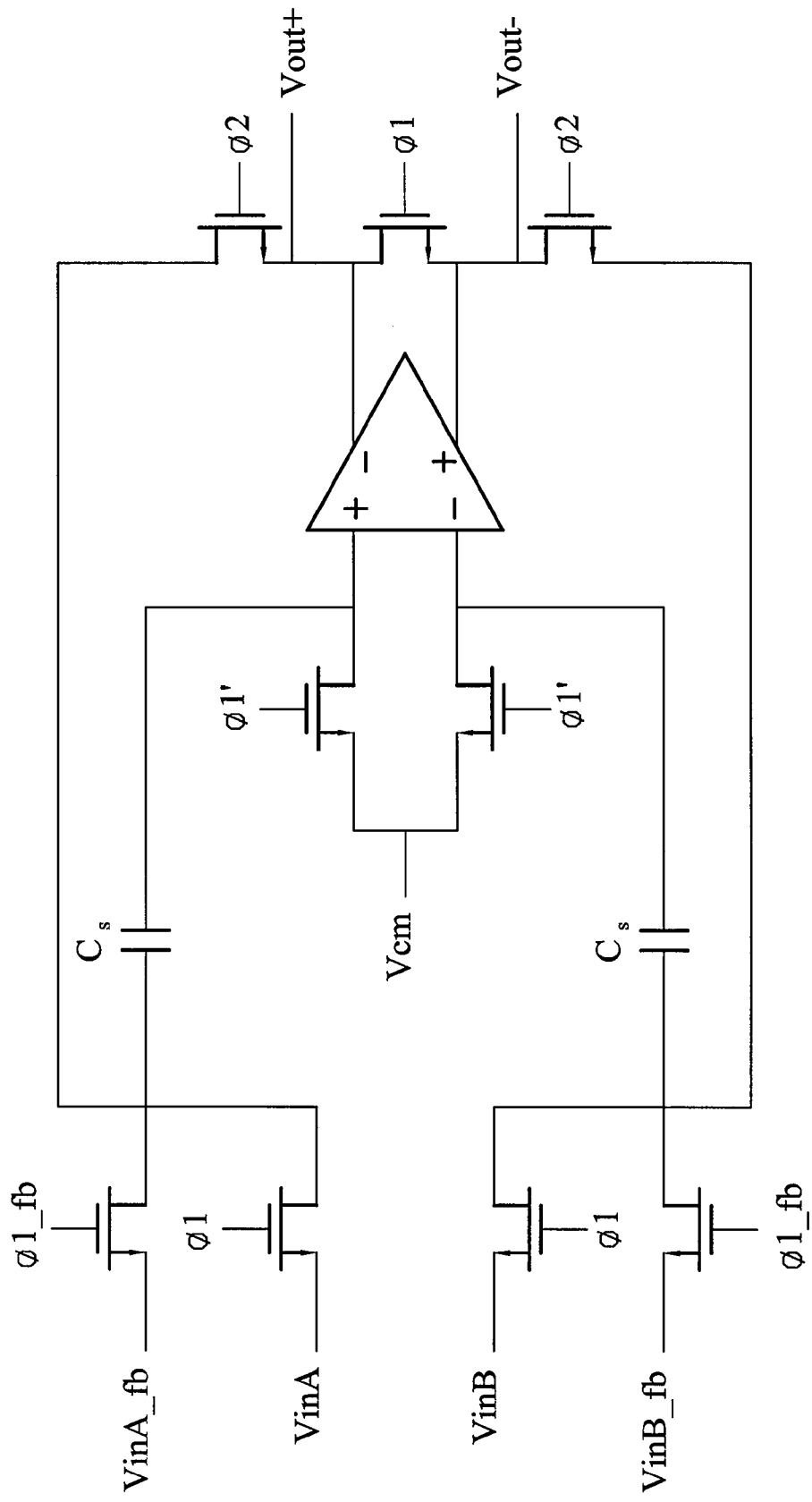
FIG. 1B is a circuit diagram of a sample and hold circuit in a flip-around cyclic pipeline ADC.
Figure 2:
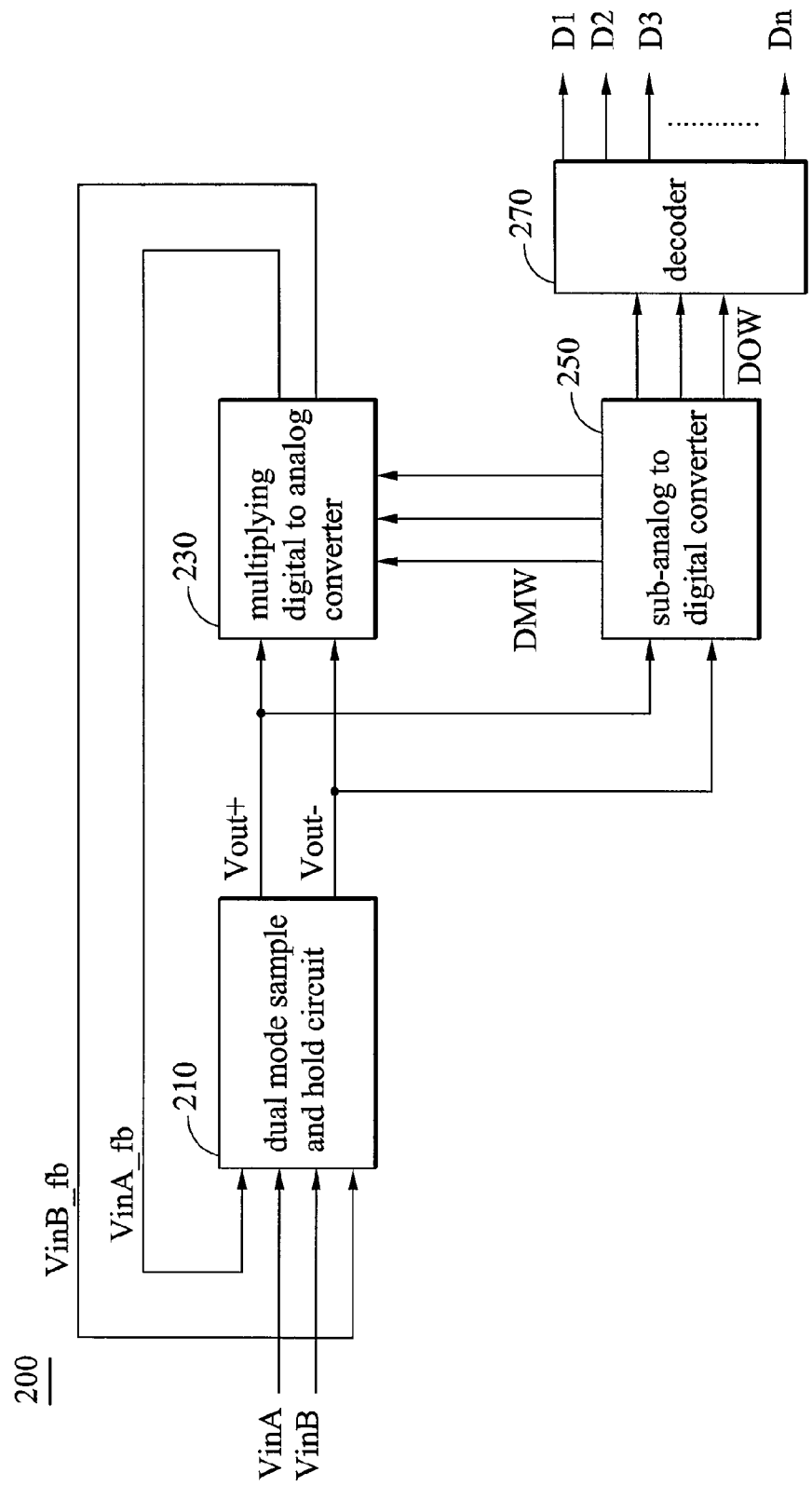
FIG. 2 is a block diagram of a cyclic pipeline analog to digital converter according to an embodiment of the invention.

FIG. 2 is a block diagram of a cyclic pipeline analog to digital converter according to an embodiment of the invention. The cyclic pipeline analog to digital converter 200 includes dual mode sample and hold circuit 210, a multiplying digital to analog converter (MDAC) 230, a sub-analog to digital converter (sub-ADC) 250 and a decoder 270. The dual mode sample and hold circuit 210 has a charge-redistribution mode and a flip-around mode. The dual mode sample and hold circuit 210 receives first and second input voltages VinA, VinB and first and second feedback voltages VinA_fb, VinB_fb and generates a differential output signal pair Vout+, Vout−. The MDAC receives the differential output signal pair Vout+, Vout− and a digital multiplying word DMW and generates the first and second feedback voltages VinA_fb, VinB_fb. The sub-ADC 250 receives the differential output signal pair Vout+, Vout− and generates the digital multiplying word DMW and a digital output word DOW. The decoder 270 converts the digital output word DOW to digital outputs D1 to DN corresponding to the first and second input voltages VinA, VinB.

Figure 3:
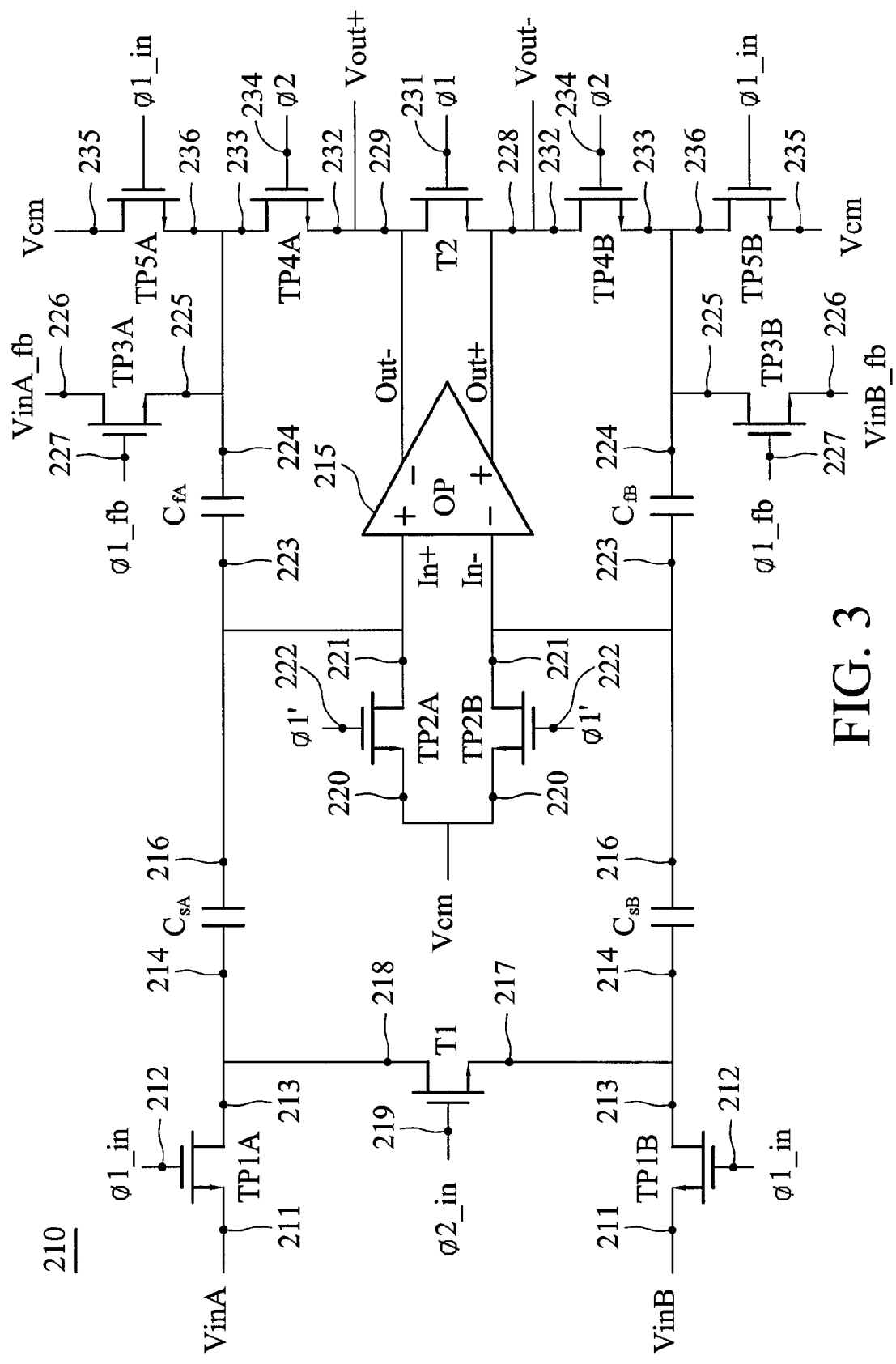
FIG. 3 is an exemplary circuit diagram of a dual mode sample and hold circuit 210 in FIG. 2.

FIG. 3 is an exemplary circuit diagram of a dual mode sample and hold circuit 210 in FIG. 2. The sample and hold circuit 210 includes a first MOS transistor pair TP1A, TP1B, a sampling capacitor pair $C_{sA}$, $C_{sB}$, a differential operational amplifier 215, a first MOS transistor T1, a second MOS transistor pair TP2A, TP2B, a holding capacitor pair $C_{fA}$, $C_{fB}$, a third MOS transistor pair TP3A, TP3B, a second MOS transistor T2, a fourth MOS transistor pair TP4A, TP4B, and a fifth MOS transistor pair TP5A, TP5B. Sources 211 of the first MOS transistor pair TP1A, TP1B respectively receive the first and second input voltages VinA, VinB and gates 212 thereof are controlled by a sampling signal Φ1_in. The sampling capacitor pair $C_{sA}$, $C_{sB}$ has first ends 214 respectively coupled to drains 213 of the first MOS transistor pair TP1A, TP1B. The differential operational amplifier 215 has a differential input pair In+, In− coupled to the other ends 216 of the sampling capacitor pair $C_{sA}$, $C_{sB}$ and a differential output pair Out+, Out− generating the differential output signal pair Vout+, Vout−. Sources 217, 218 of the first MOS transistor T1 are respectively coupled to the drains 213 of the first MOS transistor pair TP1A, TP1B and a gate 219 thereof controlled by a holding signal Φ2_in. Sources 220 of the second MOS transistor pair TP2A, TP2B are commonly connected to a common voltage Vcm and respectively coupled to the differential input pair In+, In− and controlled by a first clock Φ1'. The holding capacitor pair $C_{fA}$, $C_{fB}$ has first ends 223 respectively coupled to the differential input pair In+, In−. One source 225 and one drain 225 of the third MOS transistor pair TP3A, TP3B are respectively coupled to the other ends 224 of the holding capacitor pair $C_{fA}$, $C_{fB}$. The other source 226 and the other drain 226 of the third MOS transistor pair TP3A, TP3B respectively receive the first and second feedback voltages VinA_fb, VinB_fb and a gate 227 thereof is controlled by a feedback control signal Φ1_fb. Source 228 and drain 229 of the second MOS transistor T2 are respectively coupled to the differential output pair Out+, Out− and a gate 231 thereof is controlled by a second clock Φ1. One source 232 and one drain 232 of the fourth MOS transistor pair TP4A, TP4B are respectively coupled to the differential output pair Out+, Out−. The other source 233 and the other drain 233 of the fourth MOS transistor pair TP4A, TP4B are respectively coupled to the other ends 224 of the holding capacitor pair $C_{fA}$, $C_{fB}$ and a gate 234 thereof is controlled by a third clock Φ2. One source 235 and one drain 235 of the fifth MOS transistor pair TP5A, TP5B are respectively coupled to the common voltage Vcm. The other source 236 and the other drain 236 of the fifth MOS transistor pair TP5A, TP5B are respectively coupled to the other ends 224 of the holding capacitor pair $C_{fA}$, $C_{fB}$ and a gate thereof is controlled by the sampling signal Φ1_in. It is noted that the MOS transistors and MOS transistor pairs are presented as an example. The MOS transistors and MOS transistor pairs can be replaced with electronic switches.

Figure 4:
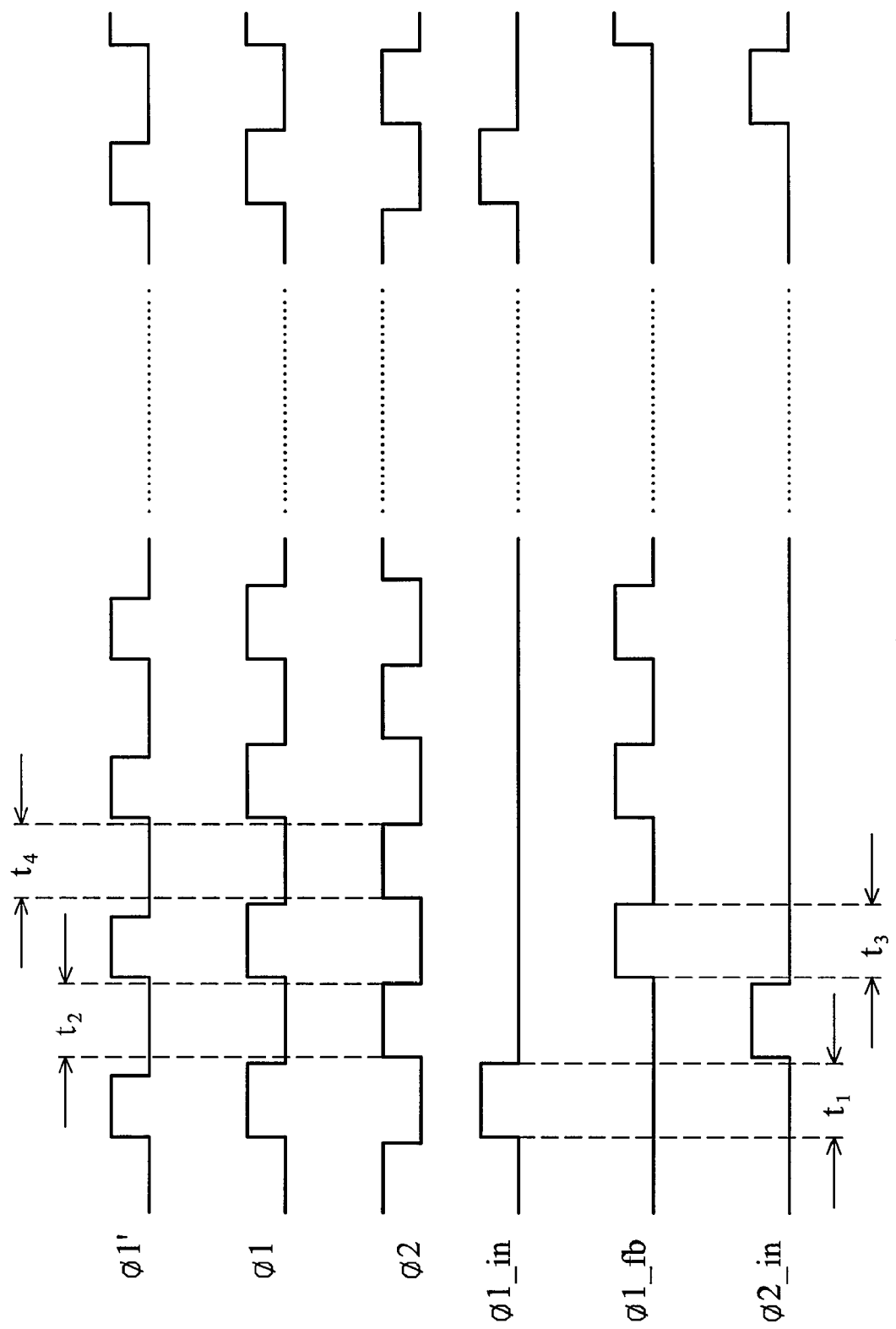
FIG. 4 is a schematic diagram showing waveforms of the sampling signal Φ1_in, the holding signal Φ2_in, feedback control signal Φ1_fb, and clocks Φ1, Φ1' and Φ2 in the dual mode sample and hold circuit in FIG. 3.

FIG. 4 is a schematic diagram showing waveforms of the sampling signal Φ1_in, the holding signal Φ2_in, feedback control signal Φ1_fb, and clocks Φ1, Φ1' and Φ2 in the dual mode sample and hold circuit in FIG. 3. In a time period t1, the sampling signal Φ1_in is at a high state, and the MOS transistor pair TP1A, TP1B is turned on. Thus, the first and second input voltages VinA, VinB are stored in the sampling capacitor pair $C_{sA}$, $C_{sB}$. In a time period t2, the holding signal Φ2_in and the clock Φ2 are at a high state, and the charge stored in the sampling capacitor pair $C_{sA}$, $C_{sB}$ is transferred to the holding capacitor pair $C_{fA}$, $C_{fB}$. In the time periods t1 and t2, the dual mode sample and hold circuit 210 is in a charge-redistribution mode. In a time period t3, the feedback control signal Φ1_fb is pulled high, and the MOS transistor pair TP3A, TP3B is turned on. Thus, the first and second feedback voltages VinA_fb, VinB_fb are transferred to the holding capacitor pair $C_{fA}$, $C_{fB}$, wherein the clock Φ1 and Φ1' are at a high state. In a time period t4, the clock Φ2 is at a high state, and the holding capacitor pair $C_{fA}$, $C_{fB}$ flips around and original input terminals are converted to the differential output pair Vout+, Vout−. In the time periods t3 and t4, the dual mode sample and hold circuit is in a flip-around mode. Thereafter, the sample and hold in every stage is performed in a flip-around mode. When next data is to be sampled and held, the dual mode sample and hold circuit 210 switches to the charge-redistribution mode.

The invention combines a charge-redistribution mode and a flip-around mode in a dual mode sample and hold circuit such that input signal is not limited to only single end signal or only differential signal. Charge-redistribution increases input common mode range and reduces impact caused by common mode errors. Flip-around reduces errors caused by noises on a circuit and capacitor matching. Combination of charge-redistribution and flip-around results in better performance. Such a circuit architecture not only reduces errors of differential nonlinearity (DNL) and integral nonlinearity (INL) of a digital to analog converter but also increases signal to noise distortion ratio (SNDR).

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A cyclic pipeline analog to digital converter, comprising:
   a dual mode sample and hold circuit, having a charge-redistribution mode and a flip-around mode, receiving first and second input voltages and first and second feedback voltages and generating a differential output signal pair;
   a multiplying digital to analog converter (MDAC), receiving the differential output signal pair and a digital multiplying word and generating the first and second feedback voltages;
   a sub-analog to digital converter, receiving the differential output signal pair and generating the digital multiplying word and a digital output word; and
   a decoder, converting the digital output word to a digital output corresponding to the first and second input voltages;
   wherein the dual mode sample and hold circuit is performed in the charge-redistribution mode, and then performed in the flip-around mode.

2. The cyclic pipeline analog to digital converter as claimed in claim 1, wherein the dual mode sample and hold circuit transfers charge stored in a sampling capacitor pair to a holding capacitor pair in the charge-redistribution mode and converting input terminals of the holding capacitor pair to a differential output pair of a differential operational amplifier in the flip-around mode.

3. The cyclic pipeline analog to digital converter as claimed in claim 2, wherein a first switch pair is turned on and first and second input voltages are stored in the sampling capacitor pair when a sampling clock is at a first voltage level, and the charge stored in the sampling capacitor pair is subsequently transferred to the holding capacitor pair when a holding signal and a second clock are at the first voltage level.

4. The cyclic pipeline analog to digital converter as claimed in claim 2, wherein a third switch pair is turned on and first and second feedback voltages are stored in the holding capacitor pair when a feedback control signal is at a first voltage level and a third clock is at a second voltage level, and the input terminals of the holding capacitor pair are subsequently converted to the differential output pair of the differential operational amplifier when the third clock is at the first voltage level.

5. A method of dual mode sampling and hold, comprising:
   transferring a charge stored in a sampling capacitor pair to a holding capacitor pair in a charge-redistribution mode; and
   providing an output corresponding to the charge stored in the holding capacitor pair to a differential output pair of a differential operational amplifier in a flip-around mode.

6. The method of dual mode sampling and hold as claimed in claim 5, wherein the charge-redistribution mode is followed by the flip-around mode.

7. The method of dual mode sampling and hold as claimed in claim 5, further comprising, in the charge-redistribution mode:
   turning on a first switch pair and storing first and second input voltages in the sampling capacitor pair when a sampling clock is at a first voltage level; and
   transferring the charge stored in the sampling capacitor pair to the holding capacitor pair when a holding signal and a second clock are at the first voltage level.

8. The method of dual mode sampling and hold as claimed in claim 5, further comprising, in the flip-around mode:
   turning on a third switch pair and storing first and second feedback voltages in the holding capacitor pair when a feedback control signal is at a first voltage level and a third clock is at a second voltage level; and
   providing an output signal corresponding to the first and second feedback voltages stored in the holding capacitor pair to the differential output pair of the differential operational amplifier when the third clock is at the first voltage level.

* * * * *